US Patent Number: 4,904,041
Date of Patent: Feb. 27, 1990
Inventor: Hossein Izadpanah, Randolph, N.J.
Assignee: Bell Communications Research, Inc., Livingston, N.J.

SHORT OPTICAL PULSE GENERATOR HAVING A LOOPED DIRECTIONAL COUPLER EXTERNAL CAVITY

Appl. No.: 287,395
Filed: Dec. 20, 1988

Int. Cl.[4] .................. G02B 6/26; H01S 3/098; H01S 3/083
U.S. Cl. .................. 350/96.15; 350/96.17; 350/96.16; 372/6; 372/18; 372/94
Field of Search .................. 350/96.10, 96.13, 96.14, 350/96.15, 96.16, 96.17, 96.20; 250/227; 372/6, 18, 19, 25, 29, 43, 49, 94

References Cited

U.S. PATENT DOCUMENTS

| | | | |
|---|---|---|---|
| 4,136,929 | 1/1979 | Suzaki | 350/96.15 |
| 4,473,270 | 9/1984 | Shaw | 350/96.15 |
| 4,530,097 | 7/1985 | Stokes et al. | 372/6 X |
| 4,635,263 | 1/1987 | Mollenauer | 372/6 X |
| 4,652,079 | 3/1987 | Shaw et al. | 350/96.15 |
| 4,665,524 | 5/1987 | Cotter | 372/13 |
| 4,667,331 | 5/1987 | Alferness et al. | 372/18 X |
| 4,728,168 | 3/1988 | Alferness et al. | 350/96.14 |
| 4,794,598 | 12/1988 | Desurvire et al. | 372/3 |
| 4,794,617 | 12/1988 | Boeck | 372/6 X |
| 4,831,631 | 5/1989 | Haeussler et al. | 372/6 X |
| 4,839,898 | 6/1989 | Payne et al. | 372/6 |
| 4,852,117 | 7/1989 | Po | 372/6 X |

FOREIGN PATENT DOCUMENTS

| | | | |
|---|---|---|---|
| 60-145681 | 8/1985 | Japan | 372/18 X |

OTHER PUBLICATIONS

"Active Modelocking of an InGaAsP 1.55 um Laser in a Fiber Resonator with Integrated Single Mode Output Port", G. Eisenstein et al., Electrn. Lett. 21, pp. 173-175, 1985.

"Generation of Self-Sustained Optical Pulses from Transients in External Cavity Semiconductor Laser", Hossein Izadpanah, Electrn. Lett. 24, pp. 137-139, 1988.

"Switched Optical Delay-Line Signal Processors", R. I. MacDonald, Journal of Lightwave Techn., Lt-5, No. 6, pp. 856-861, 1987.

"Modelocked Lasers and Ultrashort Pulses"-Parts I & II, Bernard Couillaud et al., Lasers & Applications, pp. 79-94, Jan. 1985.

"A $Nd^{3+}$-Doped cw Fiber Laser All-Fiber Reflectors", I. D. Miller et al., Applied Optics, vol. 26, No. 11, pp. 2197-2201, Jun. 1, 1987.

"Narrow Bandwidth Optical Waveguide Transmission Filters", K. O. Hill et al., Electronic Letters, vol. 23, No. 9, pp. 465-466, Apr. 23, 1987.

"Optical Fiber Delay-Line Signal Processing", K. P. Jackson et al., IEEE Transactions on Microwave Theory and Techniques, vol. MTT-33, No. 3, pp. 193-209, Mar. 1985.

*Primary Examiner*—William L. Sikes
*Assistant Examiner*—Brian M. Healy
*Attorney, Agent, or Firm*—James W. Falk; Stephen M. Gurey

[57] ABSTRACT

A short optical pulse generator is disclosed in which the optical radiation from a driven laser diode (101) is coupled to an external cavity which includes a looped directional coupler (104, 120) which reflects a portion of the optical radiation back to the laser causing the laser to mode-lock and produce an output which consists of a stream of very short high repetition optical pulses. By changing the length of the loop (107), the repetition rate of the pulse stream can be varied and by adjusting the coupling coefficient of the coupler either mechanically or electrooptically, the pulse width and pulse height parameters of the pulse stream can be varied.

14 Claims, 2 Drawing Sheets $T_\ell$: PULSE REPETITION PERIOD

SHORT OPTICAL PULSE GENERATOR HAVING A LOOPED DIRECTIONAL COUPLER EXTERNAL CAVITY

BACKGROUND OF THE INVENTION

This invention relates to optical pulse generators, and more particularly to optical pulse generators which generate very short high repetition rate optical pulses for high speed data communications and signal processing applications.

In order to transmit digital signals over optical fibers at the high Gbit/sec speeds which the optical transmission medium is capable of handling or for signal processing at such high speeds, a source of very short, picosecond, high repetition rate optical pulses is required. For example, for optical transmission on an optical fiber, an optical pulse generator is needed to provide an optical pulse stream of very short high repetition rate optical pulses to gating circuitry which gates or blocks each pulse in the stream to the fiber in accordance with the "1" and "0" bits in the data stream to be transmitted. Laser mode-locking is a well known method for generating such very short high repetition rate optical pulses. A brief discussion of laser technology and mode-locking is presented for better understanding of the present invention.

A typical laser consists of two essential elements: gain and feedback. A beam of light passing through the gain, or amplifying, medium stimulates it to release its stored energy in the form of additional light that adds to, or amplifies, the beam. Feedback is achieved by placing the gain medium within a resonator (a set of mirrors that reflects the beam back and forth through the gain medium). As a results of this cumulative process, an intense coherent beam of light is produced. The light from such a laser is composed of a number of discrete wavelengths corresponding to different resonant frequencies, or modes, of the resonator.

The total output of such a laser as a function of time will depend on the amplitude, frequencies, and relative phases of all of these oscillating modes. If there is nothing which fixes these parameters, random fluctuations and nonlinear effects in the laser medium will cause them to change with time, and the output will vary in an uncontrolled way. If the oscillating modes are forced to maintain equal frequency spacings with a fixed phase relationship to each other, however, the output as a function of time will vary in a well-defined manner. The laser is then said to be mode-locked. The form of this output will depend on which laser modes are oscillating and what phase relationship is maintained.

More precisely, mode-locking is achieved when all of the laser's resonant longitudinal modes are generated in phase to produce a Fourier sum. This yields a series of pulses having a repetition rate corresponding to mc/2L where c is the speed of light in a vacuum, L is the cavity length and m is an integer. Such mode-locking is achieved by supplementing the internal laser cavity with an external mirror cavity. A mirror is disposed a particular distance from the crystal so that the combined cavity length is L. The external mirror provides a reflective surface for photon resonance.

It has been demonstrated that very short optical pulses can be generated via mode-locking using a fiber as the coupled external cavity. In particular, G. Eisenstein, R. S. Tucker, S. K. Korotky, U. Koren, J. J. Veselka, L. W. Stulz, R. M. Jopson, and K. L. Hall, in "Active modelocking of an InGaAsP 1.55 $\mu$m laser in a fiber resonator with integrated single mode output port," *Electrn. Lett.* 21 pp. 173–175, 1985, and the present inventor in "Generation of self-sustained optical pulses from transients in external cavity semiconductor laser", in *Electrn. Lett.* 24 pp. 137–139, 1988, have shown that lensed, single-mode, fiber cavities with a partially reflecting end can be employed successfully for mode-locking and pulse generation. In these arrangements, the end reflectively is usually provided by metalization or by a multilayer dielectric coating. Disadvantageously, in any of these arrangements, once the cavity is fabricated and coupled to the laser, the cavity length and its end reflectivity cannot be adjusted and none of the parameters of the pulse stream, such as pulse width, pulse amplitude and pulse repetition rate, which are functionally related to the length and the reflectivity of the external cavity, can be varied.

An object of the present invention is to provide an external cavity to the laser in which the parameters of the pulse stream can be varied by either mechanical or electrooptic adjustments of the external cavity parameters.

SUMMARY OF THE INVENTION

The optical pulse generator of the present invention comprises a laser diode coupled to an external cavity which includes a looped optical directional coupler. The pulse width and pulse amplitude parameters of the optical pulse stream generated in the mode-locked mode are determined by the reflectivity provided by the cavity which can be varied from 0% to 100% by adjustment of the coupling coefficient of the directional coupler. The directional coupler can either be a passive coupler in which the coupling coefficient is adjusted by physically varying the distance between the fibers in the coupler, or an active coupler in which the coupling coefficient is electrooptically adjusted by a signal applied to electrodes across the coupling region. The pulse repetition rate is determined by the closed fiber loop length which can be altered either by interchanging the fiber loop length or by switching different path lengths into the loop. In an embodiment which includes an additional fiber connected between the laser diode and the looped directional coupler, a compound cavity is formed which exhibits discrete resonant frequencies which are not harmonically related to the cavity round trip time.

DETAILED DESCRIPTION

Figure 1:
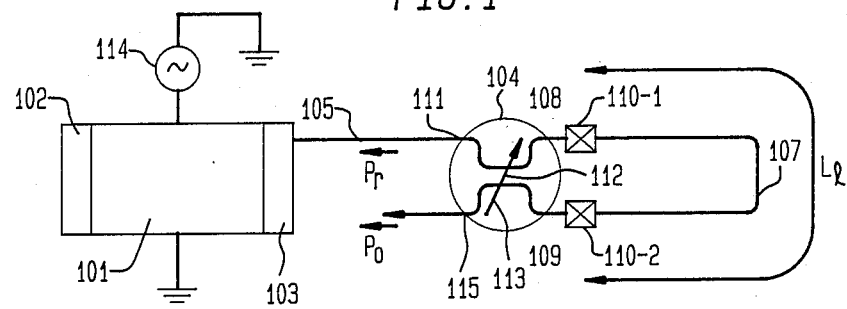
FIG. 1 is a simplified schematic drawing of the optical pulse generator of the present invention in which the laser is coupled to a passive directional coupler.
Figure 2:
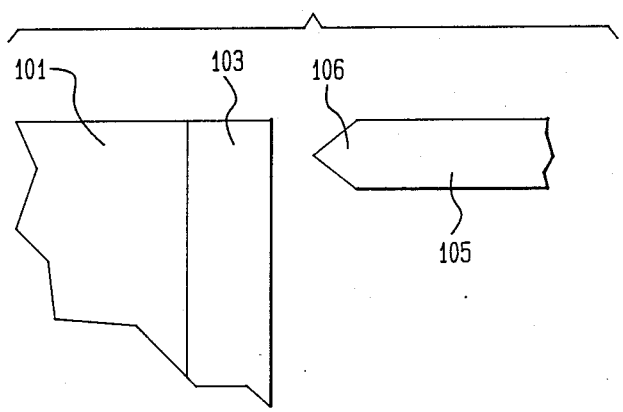
FIG. 2 is an enlargement of a portion of the pulse generator of FIG. 1.

With reference to FIG. 1, laser diode 101 is a typical, commonly available, laser diode chip having at one end a highly reflective coating or layer 102, and at its opposite end, an antireflection coating or layer 103 which can be provided by a multilayer dielectric coating by methods well known in the art. The reflectivity of the highly reflective end 102 is approximately 100% and the reflectivity of the antireflection end 103 is approximately 1%. Laser 101 is current modulated by source 114 at the mode-lock frequency, to the discussed hereinbelow. The light output of of laser 101 is coupled to an external directional coupler cavity 104 through a lensed fiber segment 105 having a negligible length. The enlargement of the end of fiber segment 105 in FIG. 2 shows an integral microlens 106 on fiber segment 105 disposed adjacent to laser 101 so that the light emitted from end 103 is focused directly through fiber 105 and to input port 111 of coupler 104.

With reference again to FIG. 1, coupler 104 is a conventional 2×2 passive directional coupler with zero excess loss and a variable coupling coefficient K. A closed loop 107 of length $L_l$ connects the output ports 108 and 109 of coupler 104 through optical connectors 110-1 and 110-2. When a pulse from laser 101 is launched into input port 111 of coupler 104, its power is split in the coupling region 112 of coupler 104 into two propagating waves that counter-rotate around closed loop 107. After one loop-delay time, both waves simultaneously return to the coupling region 112 where further power exchange takes place between the two waves. As a result, depending upon the value of coupling coefficient K, a fraction of the original pulse power reenters the laser port providing an optical feedback to the laser, a requirement for mode-locking. Accordingly, coupler 104 appears as a virtual reflector or partially reflecting mirror in the external cavity of the laser, the reflectivity of which is adjustable by mechanically adjusting 113 the separation of the fibers in coupling region 112.

Figure 3:
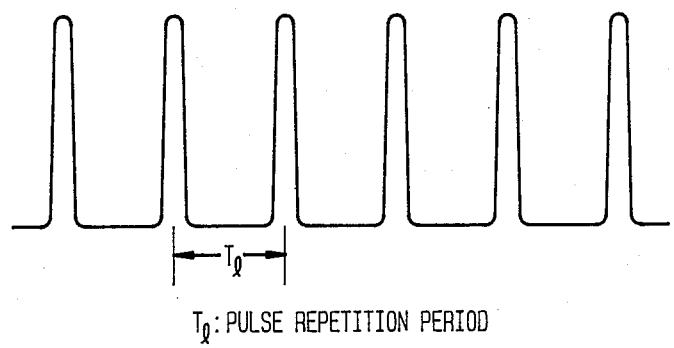
FIG. 3 is a graph of the time varying optical output of the pulse generator in FIG. 1.

When, as aforenoted, the laser is directly connected to the coupler with a negligible fiber length 105, the returned pulse is delayed by $$T_l = n_r \frac{L_l}{c} \quad (1)$$

where n, is the refractive index of the fiber and c is the speed of light in air. By modulating, via modulator 114, the current through laser 101 at a frequency $f_m = 1/T_l$, the periodic optical feedback signal returned from coupler 104 will be synchronized with the modulation period and the laser will be in an active mode-lock state generating an output at port 115 of coupler 104 which is a steady-state optical pulse train of a type shown in FIG. 3 in which the pulse repetition rate is the aforenoted $f_m$.

Advantageously, the value of $f_m$ can be readily varied by changing the length, $L_l$, of loop 107. This can be accomplished either by mechanically replacing loop 107 with a loop of a different length or, in integrated form, by switching different path lengths into the loop in a manner disclosed by R. I. Macdonald in "Switched optical delay-line signal processors," in *J. Lightwave Techn.*, LT-5, No. 6, pp. 856–861, 1987. Either way, the required loop length, $L_l$, for a given pulse repetition rate, $f_m$, is determined using equation (1). The frequency of modulator 114 is then adjusted accordingly.

Figure 4:
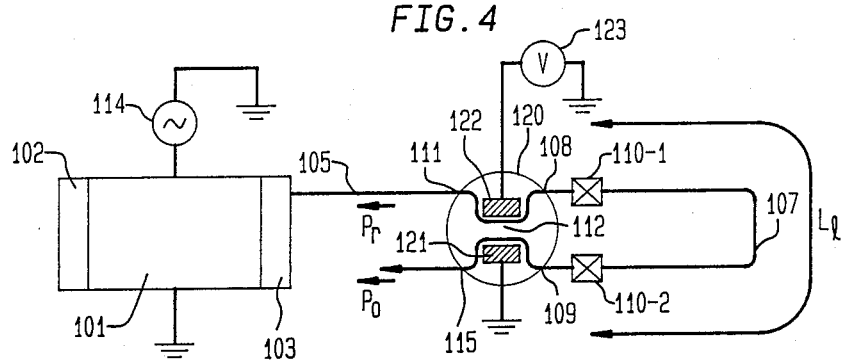
FIG. 4 is a simplified schematic drawing of the optical pulse generator of the present invention in which the laser is coupled to an active directional coupler.

The same external cavity properties can also be obtained when coupler 104 is replaced by an active electrooptic directional coupler switch as shown in FIG. 4. Similar numerical designations are given to elements common in FIGS. 1 and 4. As noted in FIG. 4, electrooptic coupler 120 includes electrodes 121 and 122 disposed adjacent to the coupling region 112. Electrode 122 is connected to a variable voltage source 123 which controls the magnitude of the coupling of the coupler and thus the reflectivity of the external cavity. Compared with the passive coupler, the active coupler offers additional advantages of smaller overall size, active control of reflectivity and delay times, and the possibility of monolithic integration with the laser.

Adjustment of the coupling coefficient of either passive coupler 104 in FIG. 1 or active coupler 120 in FIG. 4, controls the reflectivity of the external cavity and thus the signal power, $P_r$, returned via port 111 to laser 101 and the output signal power $P_o$ at port 115. When coupler 104 or 120 is in the complete "×" state, the signal at input port 111 is fully coupled to output port 109 which is then fully coupled from port 108 to port 115. The reflectivity of the coupler is thus 0% and all power is coupled to the output port 115 and mode-locking is not achieved. Similarly, when coupler 104 or 120 is in the complete "—" state, the signal at input port 111 is fully coupled to output port 108 and then from port 109 to port 115. Again all input power is coupled to the output and no signal is fed back to laser 101 to achieve mode-locking. At some intermediate coupling coefficient 100% reflectivity will be achieved whereby the power $P_{in}$ at port 111 is fully coupled back thereto. Since, however, no signal appears at port 115, the output power $P_o$ is zero and an output pulse stream is not generated. Accordingly, a reflectivity greater than 0% and less than 100% is required to effect the desired mode-locking.

Figure 5:
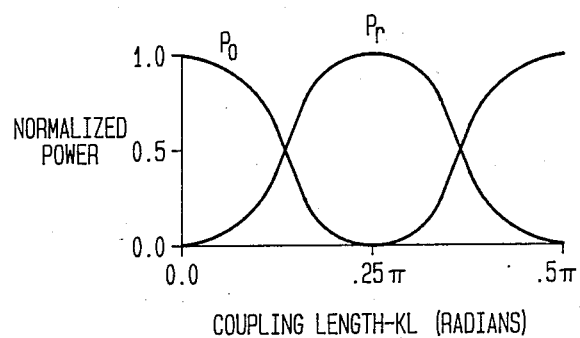
FIG. 5 is a graph of the normalized reflected and output powers of the pulse generator in either FIGS. 1 or 4 versus coupling length.

The graph in FIG. 5 illustrates the normalized reflected and output powers $P_r$ and $P_o$, respectively, versus the coupling length, KL, of the coupler, in radians, where K is the coupling coefficient of the coupler and L is the length of the coupling interaction region 112. Adjustment of the coupling coefficient of coupler 104 or 120 either mechanically or electrooptically, respectively, therefore adjusts the output and reflected signal powers which is manifested by variations in the output pulse train parameters of pulse width and pulse height.

Figure 6:
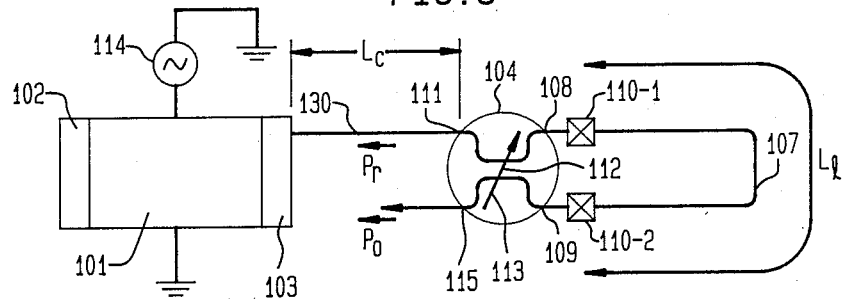
FIG. 6 is a simplified schematic drawing of an alternative embodiment of the pulse generator of the present invention which exhibits discrete resonant frequencies not harmonically related to the cavity round trip time.

In the discussions hereinabove it was assumed that the lensed fiber segment 105 has a negligible length such that there was no interaction between incoming and reflected pulses in the coupling region. However, if the laser is connected to the coupler via an additional fiber 130 of length $L_c$ as shown in FIG. 6, then, depending on the length ratio of $L_c$ and $L_l$ and the modulation frequency, a situation may arise where incoming pulses may coincide in the coupling region with the reflected pulses. Under these conditions, a more complicated interaction takes place between the incident and reflected pulses depending on their relative phases and spatial lengths. Such interactions change the nature of the reflected and output power at different modulating frequencies by forming an external laser cavity having compound cavity characteristics. In particular, the coupling region of coupler 104 between the two fibers 130 and 107 acts as a point of discontinuity for the circulating optical pulse in the compound cavity. The fibers on either side of this point can act as independent resonators accommodating different sets of standing-waves corresponding to m $\lambda/2$ where $\lambda$ is the external modulating signal wavelength and m is an integer. Accordingly, many possible end-to-end length values of resonant frequencies or their multiples are selectable for modulation. In particular, frequencies corresponding to delay lengths of $L_c$, $2L_c$, $L_l$, $L_c+L_l$, and $2L_c+L_l$ are resonant. In addition, frequencies harmonically related to these fundamentals and their combinations are resonant in the compound cavity. Accordingly, the use of the looped directional coupler gives a "multilength" nature to the laser extended cavity not possible with conventional fiber cavities.

The above-described embodiments are illustrative of the principles of the present invention. Other embodiments may be devised by those skilled in the art without departing from the spirit and scope of the present invention.

What is claimed is:

1. An optical pulse generator comprising:
   a semiconductor laser diode including a reflective end and a nonreflective end, optical radiation being emitted from said nonreflective end when said diode is driven; and
   an external cavity disposed to capture the optical radiation emitted from said nonreflective end and having a partially reflective end for reflecting a portion of the captured optical radiation back into said diode to induce mode-locking in said laser and generation of a stream of optical pulses
   characterized in that
   said external cavity comprises a 2×2 directional coupler having first and second input ports and first and second output ports, and a fiber loop, said first input port being connected to receive the optical radiation emitted from said nonreflective end, and said first and second output ports being connected together by means of said fiber loop, said coupler coupling portions of said emitted radiation onto both ends of said fiber loop to counter-propagate thereon and for coupling portions of the counter-propagating radiation back to said laser diode to induce and maintain said mode-locking, an output in the form of an optical pulse train of short optical pulses being produced at the second input port of said coupler at a frequency which is a function of the length of said fiber loop.

2. An optical pulse generator in accordance with claim 1 wherein said directional coupler has an adjustable coupling coefficient.

3. An optical pulse generator in accordance with claim 2 wherein said directional coupler is a passive coupler.

4. An optical pulse generator in accordance with claim 2 wherein said directional coupler is an active coupler.

5. An optical pulse generator in accordance with claim 2 further comprising means for changing the length of the loop connecting the output ports.

6. An optical pulse generator in accordance with claim 5 wherein said means for changing the length of the loop comprises means for switching loops of different lengths between said output ports.

7. An optical pulse generator in accordance with claim 1 wherein one end of a fiber of finite length is disposed to capture the optical radiation from said laser and a second end of said fiber is connected to said first input port of said directional coupler, the frequency of the optical pulse train at said second input port of said coupler being a function of the lengths of both said fiber of finite length and the length of said fiber loop.

8. An optical pulse generator in accordance with claim 7 wherein said directional coupler has an adjustable coupling coefficient.

9. An optical pulse generator in accordance with claim 8 wherein said directional coupler is a passive coupler.

10. An optical pulse generator in accordance with claim 8 wherein said directional coupler is an active coupler.

11. An optical pulse generator in accordance with claim 8 further comprising means for changing the length of the loop connecting the output ports.

12. An optical pulse generator in accordance with claim 11 wherein said means for changing the length of the loop comprises means for switching loops of different lengths between said output ports.

13. A short optical pulse generator comprising:
    a laser diode having a reflective end and a nonreflective end, optical radiation being emitted from said nonreflective end when said diode is driven; and
    external cavity means coupled to said laser diode for mode-locking optical pulses from said diode comprising:
    a 2×2 directional coupler having first and second input ports and first and second output ports, said first input port being connected to said laser diode to capture said optical radiation; and
    a fiber loop connected between said first and second output ports of said directional coupler;
    said directional coupler coupling portions of said optical radiation to both ends of said fiber loop to counter-propagate thereon and for coupling portions of the said counter-propagating radiation back to said diode from said first input port to induce and maintain mode locking thereby producing an optical pulse train of short optical pulses at said second input port of said coupler, the coupling coefficient of said directional coupler determining the width and amplitude of the pulses in the pulse train and the length of said fiber loop determining the pulse repetition rate of said pulses.

14. A short optical pulse generator in accordance with claim 13 further comprising means for varying said coupling coefficient.

* * * * *